Dec. 1, 1970 C. F. CASSON 3,544,850
SOLID STATE LOGIC CIRCUIT MEANS WITH CONTROLLED LATCHING RELAYS AND THE LIKE
Filed Oct. 10, 1968
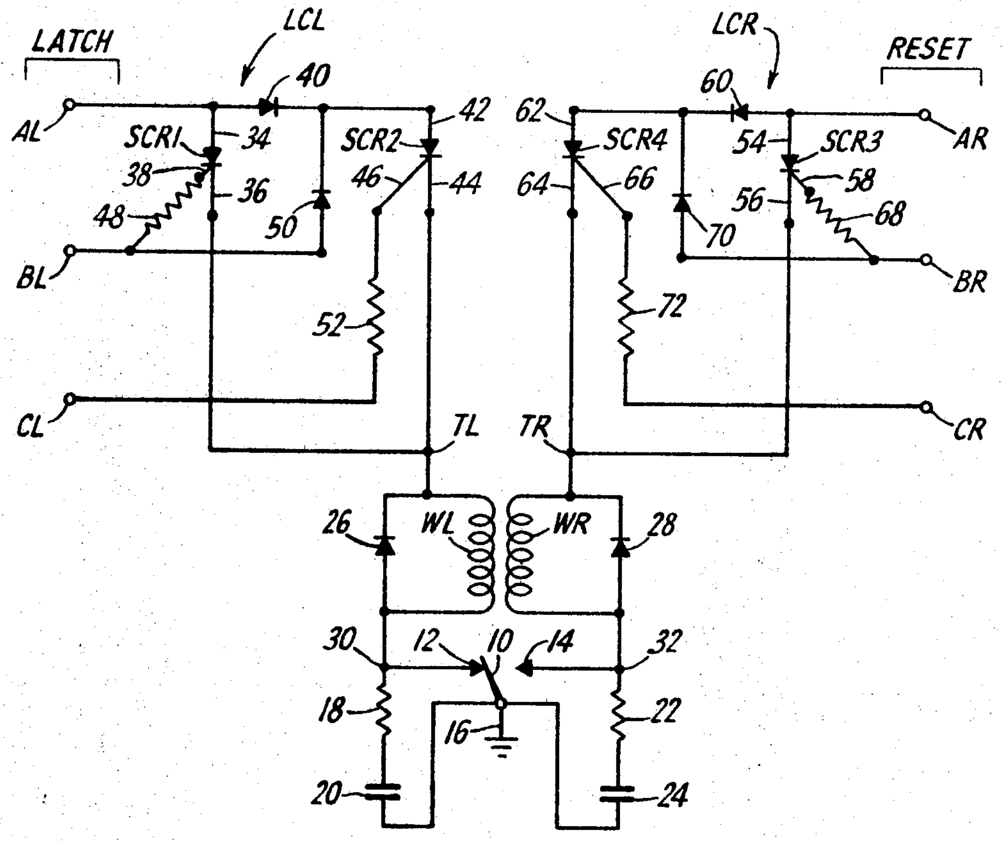
INVENTOR.
CHARLES F. CASSON
BY Charles J. Worth
AGENT

1

3,544,850

SOLID STATE LOGIC CIRCUIT MEANS WITH CONTROLLED LATCHING RELAYS AND THE LIKE

Charles F. Casson, Winslow, Ind., assignor to American Machine & Foundry Company, a corporation of New Jersey Filed Oct. 10, 1968, Ser. No. 766,496

Int. Cl. H01h 47/00

U.S. Cl. 317—137 17 Claims

ABSTRACT OF THE DISCLOSURE

A logic relay circuit including a bistable relay having "set" and "reset" latching coil and a pair of logic circuits each connected to energize one of the coils by its output. Each logic circuit having a series of silicon controlled rectifiers, an input connected to the anodes of all the controlled rectifiers, and a plurality of other inputs each connected to the gate of one of the controlled rectifiers and to the anodes of all the subsequent controlled rectifiers so that simultaneous energization of any two inputs will fire at least one controlled rectifier to provide a coil energizing output.

This invention relates to switching devices and more particularly to bi-stable electro-mechanical switches having solid state input networks selectively responding to coincident input signals to selectively effect a change of state of the bi-stable switch device or a null or override to the occurrence of an input which would otherwise effect such a change of state.

In relay circuits responsive to logic signals, and in particular, in such relay circuits in which bi-stable relays are provided with differential windings, i.e., "latch" and "reset" windings with opposed mutual coupling controls are needed to effect changes of state between "latch" and "reset" contact positions as well as to effect a nullification of conflicting input constraints should these occur, leaving the immediate or existing stable state unchanged.

It is. therefore, an object of this invention to provide new and novel coincident logic responsive solid-state input circuitry by bi-stable relay devices and the like.

Another object of this invention is to provide new and novel solid-state logic circuitry having an excess of two input terminals which is responsive to coincident inputs at two or more of such input terminals to effect a predetermined control function.

Another object of this invention is to provide new and novel solid-state logic circuitry having an excess of two input terminals which is responsive to coincident inputs at two or more of such input terminals to effect a predetermined control function.

Another object of this invention is to provide new and novel solid-state logic circuitry having an excess of two input terminals which is responsive to concident inputs at two or more of such input terminals to effect a predetermined control function; wherein the active elements of said logic circuitry comprise silicon controlled rectifiers.

Still another object of this invention is to provide new and novel solid-state logic circuits for driving bi-stable relay devices in which, under given conditions, simultaneous application of conflicting input logic will preclude a change of state of said bi-stable relay devices.

Yet another object of this invention is to provide new and novel solid-state logic circuits for bi-stable relays having a winding for each stable state thereof, each said winding having a logic circuit controlling its energization, and each such logic circuit having an excess of two input terminals and being responsive to coincident input signals at two or more of said input terminals.

2

These and other objects of this invention will become more fully apparent with reference to the following specification and drawing which relate to a preferred embodiment of the present invention.

The drawing is a schematic diagram of a bi-stable latching relay circuit embodying the coincidence logic circuits of the present invention.

Basically, the invention contemplates, in a logic circuit, a combination of bi-stable, unidirectional, gated solid state devices such as silicon controlled rectifiers (hereinafter referred to as SCR's), interconnected through blocking diodes and a plurality of input terminals such that both forward bias and gating signals for one or all of such devices (SCR's) will be effected by the application of coincident inputs to any given pair of said plurality of input terminals. With such logic circuits controlling respective ones of the differential control windings of a bi-stable relay device, a change of state or a null response of said relay device to various input logic can be readily effected.

Referring in detail to the drawing, a bistable "latching" relay R is shown as including a left winding means WL and a cooperating, opposed field, right winding means WR. Selective energization of the left and right winding means WL and WR constrains a movable relay contact means 10 to assume one of two (2) stable positions, i.e., in engagement with either a fixed left contact 12 or a fixed right contact 14. The left fixed contact 12 is coupled to the movable relay contact 10 and a ground 16 by a first RC network comprising a resistance 18 and a capacitance 20. The right fixed contact 14 similarly is connected to the movable contact 10 and ground 16 by a second RC network comprising a resistance 22 and a capacitance 22.

The left relay winding WL is connected at one end to both the left fixed contact 12 and the resistance 18 of the first RC network by a common junction 30. The right relay winding WR similarly is connected to the right fixed contact 14 and the resistance 22 of the second RC network by another common junction 32. It should be seen that the RC networks 18–20 and 22–24 permit the respective relay coils WL and WR to draw current when the corresponding relay contacts are open to facilitate pull-in.

The other or opposite ends of the left and right relay windings WL and WR are directly connected to respective output terminals TL and TR of left and right coincidence logic circuits LCL and LCR, respectively. A diode 26, connected in parallel with the left relay winding WL between terminal TL and junction 30, is anode connected to the left logic circuit LCL. A corresponding diode 28 is similarly connected to the right logic circuit LCR and in parallel with the right relay winding WR. The diodes 26 and 28 are provided as means to protect silicon controlled rectifiers of the logic circuits LCL and LCR, respectively, from inductive kicks or current reversals.

The left coincidence logic circuit LCL is shown as including first, second, and third left signal input terminals AL, BL, and CL, respectively, and first and second silicon controlled rectifiers SCR1 and SCR2. The anode terminal 34 of the controlled rectifier SCR1 is connected to the first signal input terminal AL of the logic circuit LCL and to the anode of a blocking diode 40 which is cathode connected to the anode terminal 42 of the controlled rectifier SCR2. The cathdode terminals 36 and 44 of the controlled rectifiers SCR1 and SCR2, respectively, are both directly connected to the output terminal TL of the left coincidence logic circuit LCL.

The second left input terminal BL is connected through a first grid resistance 48 to the gate terminal 38 of the controlled rectifier SCR1 and to the anode of a second blocking diode 50 which is cathode connected to the cathode of blocking diode 40 and the anode 42 of controlled rectifier SCR2. The third left input terminal CL is connected through a second grid resistance 52 to the gate terminal 46 of the controlled rectifier SCR2 to complete the left coincidence logic circuit LCL.

The right coincidence logic circuit LCR is shown as including first, second and third right signal input terminals AR, BR and CR, respectively, and third and fourth silicon controlled rectifiers SCR3 and SCR4. The anode terminal 54 of the controlled rectifier SCR3 is connected to the first signal input terminal AR of the logic circuit LCR and to the anode of a blocking diode 60 which is cathode connected to the anode terminal 62 of the controlled rectifier SCR4. The cathode terminals 56 and 64 of the controlled rectifiers SCR3 and SCR4, respectively, are both directly connected to the output terminal TR of the right coincidence logic circuit LCR.

The second right input terminal BR is connected through a third grid resistance 68 to the gate terminal 58 of the controlled rectifier SCR3 and to the anode of a fourth blocking diode 70 which is cathode connected to the cathode of blocking diode 60 and the anode 62 of controlled rectifier SCR4. The third right input terminal CR is connected through a fourth grid resistance 72 to the gate terminal 66 of the controlled rectifier SCR4 to complete the right coincidence logic circuit LCR.

OPERATION

As schematically indicated in the drawing, the input signals to the coincidence logic circuits LCL and LCR may be in the form of positive going "latch" and "reset" pulses, respectively, applied to the left and right input terminals AL–CL and AR–CR.

Assuming that the movable contact 10 of the bistable relay R is in the "latch" state, i.e., engaged with the left fixed contact 12, there are several response possibilities of the bi-stable relay R to input signals at the input terminals of the coincidence logic circuits LCL and LCR, as follows:

(1) State changes to "reset":
- (a) No input signals to left coincidence logic circuit LCL; and
- (b) Proper coincidence input signals to right coincidence logic circuit LCR.

(2) State remains unchanged:
- (a) No input signals to right coincidence logic circuit LCR; and
- (b) No input signals to left coincidence logic circuit LCL; or
- (c) Proper coincidence of input signals to left coincidence logic circuit LCL.

(3) State remains unchanged:
- (a) Proper coincidence of input signals to left coincidence logic circuit LCL; and
- (b) Substantially simultaneous occurrence of proper coincidence of input signals to right coincidence logic circuit LCR.

Each of the coincidence logic circuits LCL and LCR and responsive to coincident input pulses, i.e., those having a sufficient pulse-duration overlap, at two or more of the input terminals AL–CL and AR–CR thereof, to effect a conductive state in one or more of the respectively associated SCR's therein, thereby conducting a pulse through one of the relay windings WL and WR to ground 16. This response is effected as follows:

Assuming the above-defined response condition No. 1, and the application of coincident reset pulses to first and second right input terminals AR and BR, the controlled rectifier SCR3 will be rendered conductive. This occurs since a positive voltage will be simultaneously applied to the anode terminal 54 of the controlled rectifier SCR3 from the first right input terminal AR with a positive voltage to the gate terminal 58 of the controlled rectifier SCR3 from the second right input terminal BR through the third gate resistance 68.

When the controlled rectifier SCR3 gates "ON," current will flow through the controlled rectifier SCR3, right output terminal TR, and right relay winding WR and RC network 22–24 to ground 16, causing the moveable contact 10 of the bi-stable relay R to assume its "reset" position in engagement with the right fixed contact 14.

Likewise, application of coincident reset pulses to the first and third right input terminals AR and CR or to the second and third right input terminals BR and CR will effect the same change of state of the relay R.

This occurs since from either the first right input terminal AR through the third blocking diode 60 or from the second right input terminal BR through the fourth blocking diode 70 a positive voltage is simultaneously applied to the anode terminal 62 of the controlled rectifier with a positive voltage applied from the third right input terminal CR through the fourth gate resistance 72 to the gate terminal 66 of the controlled rectifier SCR4. This gates the controlled rectifier SCR4 "ON" and causes current to flow through the controlled rectifier SCR4, right output terminal TR, right relay winding WR and RC network 22–24 to ground 16. Thus, the bi-stable relay R is constrained to assume its "reset" state.

The operation of both the left and right coincidence logic circuits LCL and LCR is identical. Thus, the foregoing description of operation applies to both. The controlled rectifiers SCR1 and SCR2 are selectively gated "ON" in response to signals applied in coincidence to two or more of the left input terminals AL–CL.

Because of the common connections of all but one of the input terminals to the anode terminals of the SCR's, and of all but another one of the input terminals being connected through gate resistances to the gate terminals of the SCR's, simultaneous or coincident input signal pulses at two or more of the input terminals will gate one or both of the SCR's "ON" in the associated one of the said coincidence logic circuits LCL and LCR.

A signal appearing at only one input terminal will not effect the requisite conditions for SCR conduction, e.g., the presence of sufficient forward bias voltage at the anode of the SCR, coincident with the presence of a sufficient gate potential. Once this coincidence occurs, the gate potential can be removed and the SCR will remain "ON" for the duration of the sufficient forward bias voltage.

Thus, a signal at any one terminal of one of the coincidence logic circuits LCL and LCR cannot effect conduction in any of the SCR's therein.

However, coincident signals at all three of the input terminals shown in each of the coincidence logic circuits LCL and LCR will result in the conduction of both of the SCR's in each.

It can now be readily seen from the foregoing description that each coincidence lgic circuit has input terminals from 1 to N (1–N), where N is an integer and (N–1) SCR's. The first of the input terminals is connected to the anodes of all of the SCR's and the Nth terminal is connected to the (N–1) SCR gate terminal. All of the remaining input terminals are respectively connected jointly to the gate terminal of a next preceeding SCR and the anode terminal of a like numbered SCR. (For example, the first SCR is gated from the second input terminal which, in turn, is connected to the anode of the second SCR, etc.)

The coincidence logic circuits and bi-stable relay control network of the present invention provide a reliable and novel circuitry with an optimally minimum number of components, providing positive control of change of state and nullification of conflicting input constraints should these occur. By increasing the number of input terminals in the coincidence logic circuits of the present invention, these circuits will readily respond to a wide number of coincidence input constraints either for monitoring or arithmetic purposes.

Although a single embodiment of the invention has been illustrated and described in detail, it is to be expressly understood that the invention is not limited thereto. Various changes may be made in the design and arrangement of the parts without departing from the spirit and scope of the invention as the same will now be understood by those skilled in the art.

What is claimed is:

1. Coincidence logic circuit means adapted to respond to coincident input constraints, comprising:
a plurality, N, of input terminals adapted to receive electrical input signals;
a plurality, N–1, of unidirectional semiconductor means each having anode, cathode and gate terminals;
said input terminals and said semiconductor means being interdisposed in respective numerical sequence.
the first of said input terminals having a common connection with said anode terminals of said plurality semiconductor means;
the last of said input terminals and the gate terminal of the last one of said semiconductor means being interconnected through a gate circuit means;
the remaining ones of said input terminals having a direct connection to the anode terminal of a next preceding semiconductor means and connected through an associated gate circuit means to the gate terminal of a like-numbered semiconductor means; and
a common output terminal directly connected to the cathode terminals of said plurality of semiconductor means; wherein,
the quantity N is a whole number greater than two.

2. The invention defined in claim 1, wherein each said gate circuit means comprises a resistance.

3. The invention defined in claim 1, wherein said logic circuit further includes blocking diode means interconnecting the anode terminals of adjacent numbered semiconductor means.

4. The invention defined in claim 1, wherein the said direct connection between said remaining ones of said input terminal and said like-numbered ones of said semiconductor means includes blocking diode means.

5. The invention defined in claim 1, wherein said logic circuit further includes blocking diode means interconnecting the anode terminals of adjacent numbered semiconductor means and in the said direct connections between said remaining ones of said input terminals and said like-numbered ones of said semiconductor means.

6. The invention defined in claim 1, wherein said logic circuit further includes blocking diode means interconnecting the anode terminals of adjacent numbered semiconductor means and in the said direct connections between said remaining ones of said input terminals and said like-numbered ones of said semiconductor means; and, further, wherein each said gate circuit means comprises a resistance.

7. The invention defined in claim 6, wherein said semiconductor means each comprise a silicon controlled rectifier.

8. The invention defined in claim 1, wherein said semiconductor means each comprise a silicon controlled rectifier.

9. Control means effecting a selected contact position of a bi-stable relay means:
said relay means including first and second differentially opposed winding means effecting first and second respective contact positions in said relay means when individually energized, said control means comprising:
first and second coincidence logic circuits associated, respectively, with said first and second winding means;
each of said logic circuits including an excess of two input terminals adapted to receive input signals, a common output terminal, and a lesser plurality of unidirectional semiconductor means than input terminals completing a circuit from at least one of said input terminals to said common output terminal upon the coincident application of input signals to at least two of said input terminals;
said common output terminal of each said logic circuit connected to a respective one of said winding means.

10. The invention defined in claim 9, wherein, in each said coincidence logic circuit, said unidirectional semiconductor means comprises a plurality, N–1, of silicon controlled rectifiers each having anode, cathode and gate terminals,
wherein said input terminals comprise a plurality, N, thereof;
said input terminals and said silicon controlled rectifiers being interdisposed in respective numerical sequence;
the first of said input terminals having a common connection with said anode terminals of said silicon controlled rectifiers;
the last of said input terminals and the gate terminal of the last of said silicon controlled rectifiers being interconnected through a gate circuit means;
the remaining ones of said input terminals having a direct connection to the anode terminal of a next preceding silicon controlled rectifier and connected through an associated gate circuit means to the gate terminal of a like-numbered silicon controlled rectifier; and
said output terminal comprising a common connection of said cathode terminals of said silicon controlled rectifiers.

11. A bi-stable relay circuit comprising:
a bi-stable relay having first and second stable switched positions and first and second differentially opposed winding means effecting, when individually energized, said first and second switched positions, respectively, of said bi-stable relay; and
first and second coincidence logic circuits associated, respectively, with said first and second winding means;
each of said logic circuits including an excess of two input terminals adapted to receive input signals, a common output terminal, and a lesser plurality of unidirectional semiconductor means than input terminals completing a circuit from at least one of said input terminals to said output terminal upon the coincident application of input signals to at least two of said input terminals;
said common output terminals of said first and second logic circuits being connected, respectively, to one side of said first and second winding means; and
the other side of each said first and second winding means being connected to a common circuit reference through said relay means.

12. The invention defined in claim 11, wherein, in each said coincidence logic circuit, said unidirectional semiconductor means comprises a plurality, N–1, of silicon controlled rectifiers each having anode, cathode and gate terminals;
wherein said input terminals comprise a plurality, N, thereof;
said input terminals and said silicon controlled rectifiers being interdisposed in respective numerical sequence;
the first of said input terminals having a common connection with said anode terminals of said silicon controlled rectifiers;
the last of said input terminals and the gate terminal of the last said silicon controlled rectifiers being interconnected through a gate circuit means;
the remaining ones of said input terminals having a direct connection to the anode terminal of a next preceding silicon controlled rectifier and connected through an associated gate circuit means to the gate terminal of a like-numbered silicon controlled rectifier; and
said output terminal comprising a common connection of said cathode terminals of said silicon controlled rectifiers.

13. The invention defined in claim 12, wherein each of said gate circuit means comprises a resistance.

14. The invention defined in claim 12, wherein said logic circuit further includes blocking diode means interconnecting the anode terminals of adjacent numbered silicon controlled rectifiers.

15. The invention defined in claim 12, wherein the said direct connection between said remaining ones of said input terminals and said like-numbered ones of said silicon controlled rectifiers includes blocking diode means.

16. The invention defined in claim 12, wherein said logic circuit further includes blocking diode means interconnecting the anode terminals of adjacent numbered silicon controlled rectifiers and in the said direct connections between said remaining ones of said input terminals and said like-numbered ones of said silicon controlled rectifiers.

17. The invention defined in claim 12, wherein said logic circuit further includes blocking diode means interconnecting the anode terminals of adjacent numbered silicon controlled rectifiers and in the said direct connections between said remaining ones of said input terminals and said like-numbered ones of said silicon controlled rectifiers; and, further, wherein each said gate circuit means comprises a resistance.

References Cited

UNITED STATES PATENTS

| | | | |
|---|---|---|---|
| 3,310,714 | 3/1967 | Gargani | 317—148.5 |
| 3,398,330 | 8/1968 | Poole | 317—148.5 |

HAROLD BROOME, Primary Examiner